United States Patent [19]
Look et al.

[11] Patent Number: 6,057,589
[45] Date of Patent: May 2, 2000

[54] METHOD FOR OVER-ETCHING TO IMPROVE VOLTAGE DISTRIBUTION

[75] Inventors: Kevin T. Look, Fremont; Yakov Karpovich, Campbell; Michael J. Hart, Palo Alto, all of Calif.

[73] Assignee: Xilinx, Inc., San Jose, Calif.

[21] Appl. No.: 09/061,817

[22] Filed: Apr. 16, 1998

[51] Int. Cl.[7] .............................. H01L 29/00; H01L 21/70
[52] U.S. Cl. .................... 257/530; 257/529; 257/232; 438/600; 438/131
[58] Field of Search .................. 257/529, 530, 257/532; 438/600, 131

[56] References Cited

U.S. PATENT DOCUMENTS

| | | | |
|---|---|---|---|
| 4,881,114 | 11/1989 | Mohsen et al. | 357/54 |
| 5,171,715 | 12/1992 | Husher et al. | 437/195 |
| 5,272,666 | 12/1993 | Tsang et al. | 365/96 |
| 5,314,840 | 5/1994 | Schepis et al. | 437/194 |
| 5,319,238 | 6/1994 | Gorden et al. | 257/530 |
| 5,449,947 | 9/1995 | Chen et al. | 257/530 |
| 5,475,253 | 12/1995 | Look et al. | 257/530 |
| 5,780,919 | 7/1998 | Chua et al. | 257/530 |
| 5,786,240 | 7/1998 | Look et al. | 438/600 |

OTHER PUBLICATIONS

S. Chiang, R. Foroubi, W. Chen, F. Hawley, J. McCollum, E. Hamdy, C. Hu, "Antifuse Structure Comparison for Field Programmable Gate Arrays," International Electron Devices Meeting, pp. 24.6.1–24.6.4, Dec. 13–16, 1992.

Primary Examiner—Leo P. Picard
Assistant Examiner—Hung Van Duong
Attorney, Agent, or Firm—Jeanette S. Harms

[57] ABSTRACT

An over-etched (OE) antifuse includes a lower electrode, an antifuse layer contacting the lower electrode by an over-etched via, and a second conductive layer formed on the antifuse layer. This over-etched via forms a trench in the lower electrode, wherein in one embodiment the depth of the trench approximates the thickness of the antifuse layer. The trench narrows the programming voltage distribution of the antifuses on the device, irrespective of topology. Because active circuits can be placed underneath the OE antifuses, the present invention dramatically reduces chip size in comparison to conventional devices.

8 Claims, 10 Drawing Sheets

METHOD FOR OVER-ETCHING TO IMPROVE VOLTAGE DISTRIBUTION

BACKGROUND OF THE INVENTION

1. Field of the Invention

The present invention relates to an antifuse, and specifically to an over-etch of an antifuse via prior to the deposition of an antifuse layer, thereby ensuring a relatively tight programming voltage distribution irrespective of the underlying topology.

2. Description of the Related Art

Antifuses are well-known programmable elements in the integrated circuit industry. Antifuses have a high impedance state before programming, but change to a low impedance (i.e. permanently conductive) state after a programming voltage is applied across its electrodes. Antifuses are typically used in programmable logic devices to programmably interconnect conductive lines.

Various antifuse structures are described in detail in, for example: U.S. Pat. No. 4,881,114, issued Nov. 14, 1989 to Mohsen et al. (provides a dielectric between semiconductors of opposite conductivity type); U.S. Pat. No. 5,272,666, issued Dec. 21, 1993 to Tsang et al. (discloses methods of fabricating an antifuse having an area of less than one micron cell area); U.S. Pat. No. 5,319,238, issued Jun. 7, 1994 to Gorden et al. (teaches planar amorphous silicon antifuse structure); and an article titled "Antifuse Structure Comparison of Field Programmable Gate Arrays" by Chiang et al., IEDM IEEE, pp. 611–614 (1992)(compares various characteristics of multiple antifuse structures).

However, conventional antifuses are currently formed only on areas having no underlying structures, i.e. a flat topology. Specifically, as described in reference to FIGS. 1A–1F and 2A–2B, conventional antifuses formed on different topologies will produce different antifuse programming voltages. This variation in programming voltages highly undesirable. Thus, reduction in chip size is severely limited because active circuits cannot be placed underneath these conventional antifuse structures without undesirably increasing the programming voltage distribution. Therefore, a need exists for an antifuse which provides a narrow distribution of programming voltages irrespective of topology.

SUMMARY OF THE PRESENT INVENTION

In accordance with the present invention, an over-etched (OE) antifuse includes a lower electrode, an antifuse layer contacting the lower electrode by an over-etched via, and a second conductive layer formed on the antifuse layer. This over-etched via forms a trench in the lower electrode, wherein in one embodiment the depth of the trench approximates the thickness of the antifuse layer. In preferred embodiments, the depth of the trench is equal to or greater than the thickness of the antifuse layer. Because different topologies require different depths of vias to fully expose the lower electrode, a high selectivity etch is used, thereby ensuring that the lower electrode is not etched through during the via formation. The trench narrows the programming voltage distribution of the antifuses on the device, irrespective of topology. Because active circuits can be placed underneath the OE antifuses, the present invention dramatically reduces chip size in comparison to conventional devices.

DETAILED DESCRIPTION OF THE DRAWINGS

In a triple metal process, layers of materials such as polysilicon, dielectrics, and conductive materials are deposited or grown on a substrate. When successive layers are deposited and patterned to form active circuitry, different topologies result. In some devices, such as the XC8100 family of devices provided by Xilinx, Inc., having an address of 2100 Logic Drive, San Jose, Calif., antifuses are randomly placed on top of the active circuitry. Therefore, a particular antifuse on a device can be situated on one of many different topologies. Possible topologies include: flat, tilt, notch, trench, low, and high topologies.

Figure 1A:
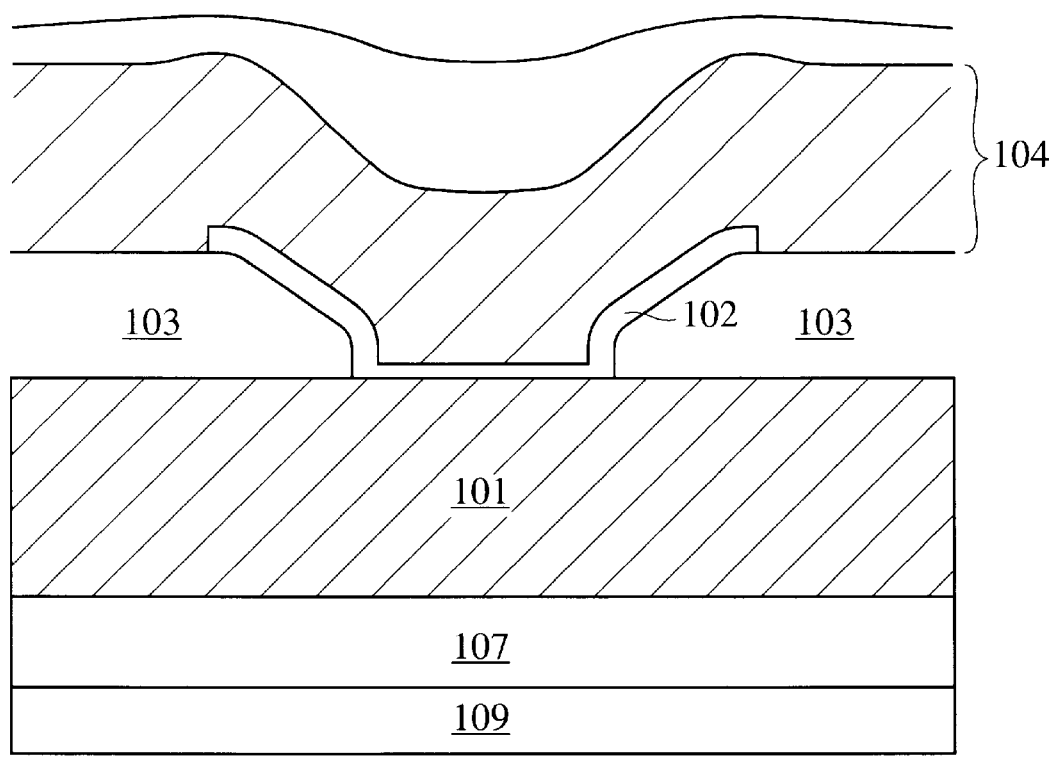
FIG. 1A illustrates a cross-sectional view of an antifuse having a flat topology.
Figure 1B:
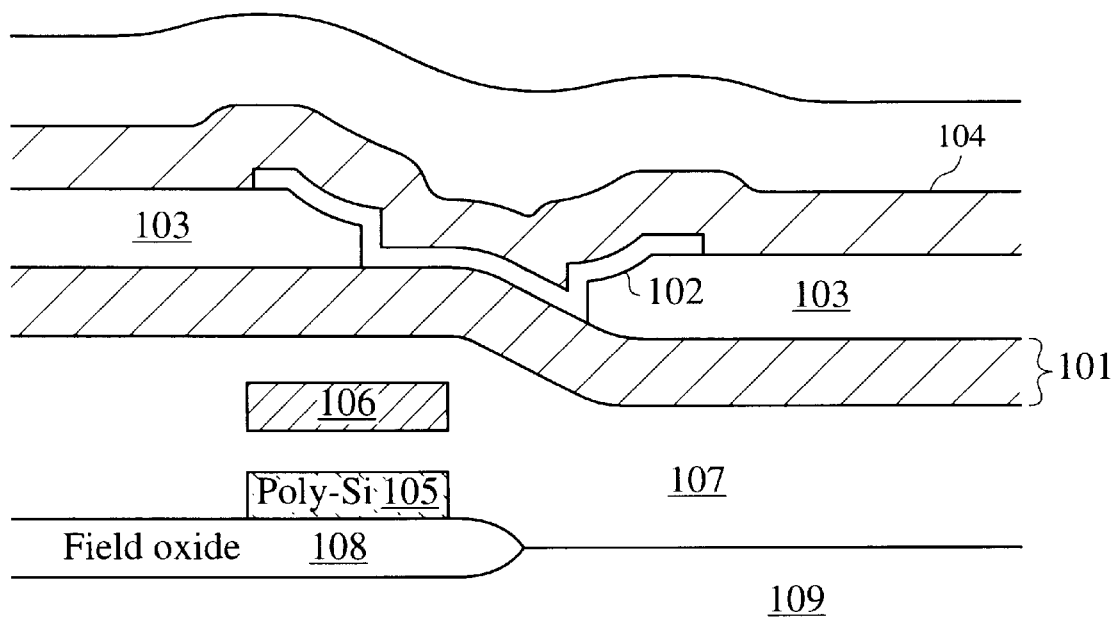
FIG. 1B illustrates a cross-sectional view of an antifuse structure having a tilt topology.
Figure 1C:
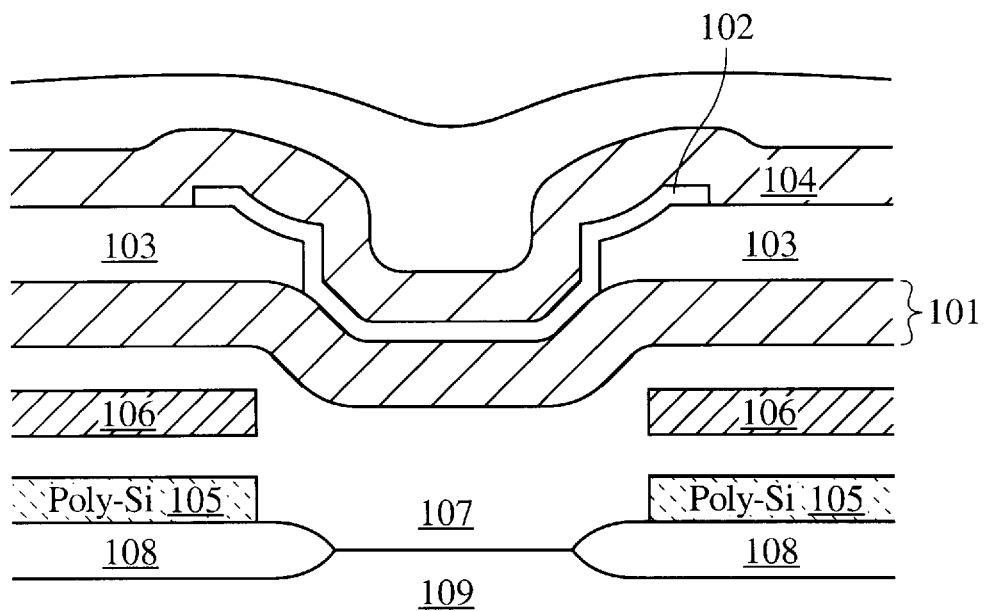
FIG. 1C illustrates a cross-sectional view of an antifuse structure having a trench topology.
Figure 1D:
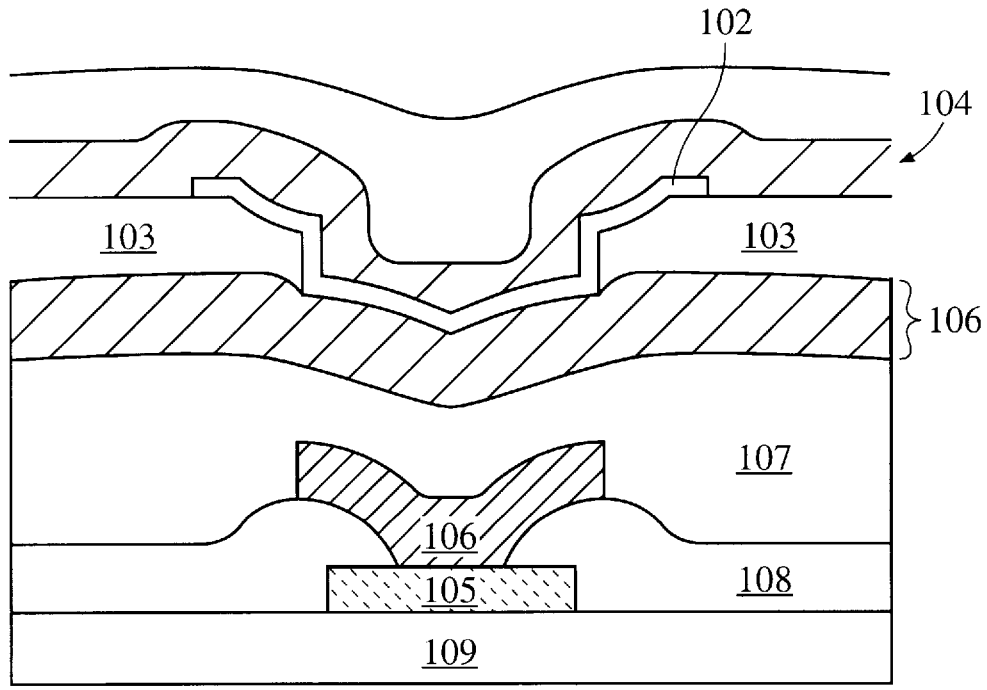
FIG. 1D illustrates a cross-sectional view of an antifuse structure having a notch topology.
Figure 1E:
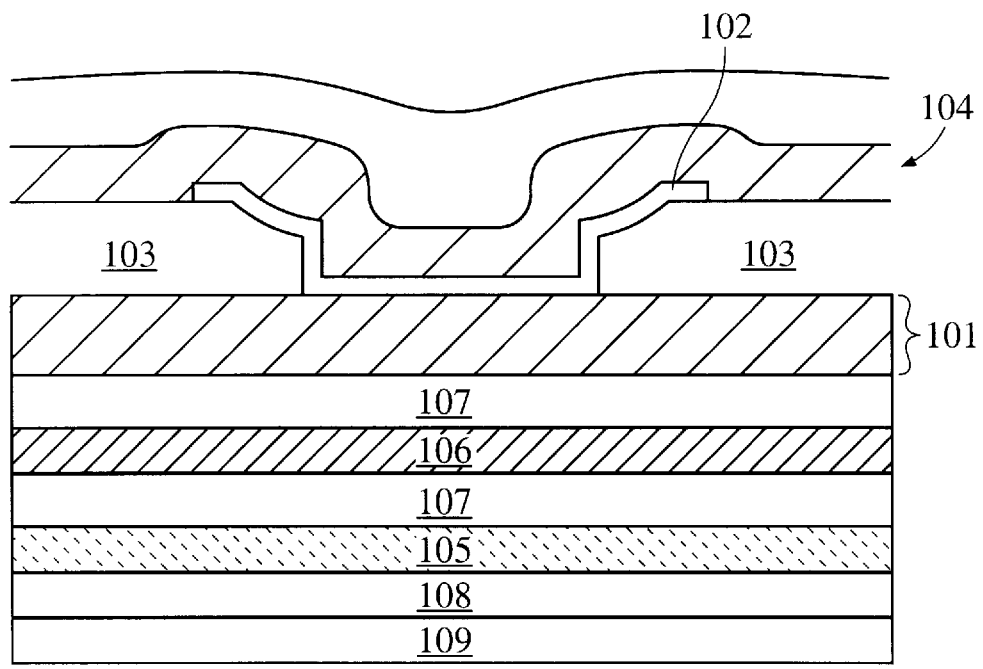
FIG. 1E illustrates a cross-sectional view of an antifuse structure having a high topology.
Figure 1F:
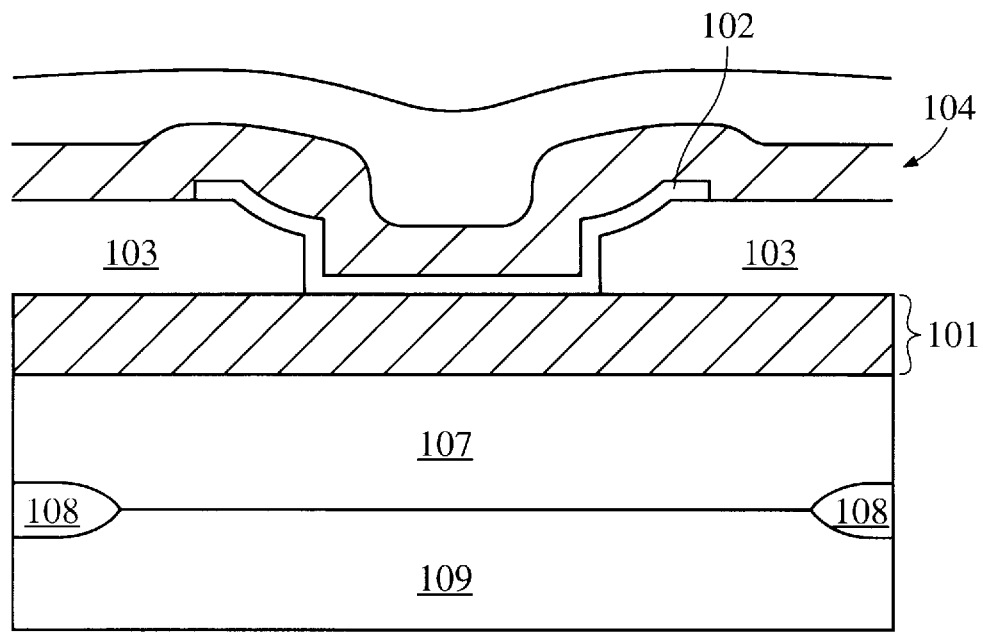
FIG. 1F illustrates a cross-sectional view of an antifuse structure having a low topology.

Referring to FIG. 1A which illustrates a flat topology, an antifuse which comprises a lower electrode 101, an amorphous silicon layer (also referenced an antifuse layer) 102, and an upper electrode 104, is positioned on a flat topology, i.e., on top of a planer portion of a dielectric layer 107. In a tilt topology shown in FIG. 1B, the antifuse is positioned at the edges of a conductive layer 106, a polysilicon layer 105, and a field oxide region 108. Referring to FIG. 1C which illustrates a trench topology, the antifuse is formed on dielectric layer 107, wherein conductive layer 106, polysilicon layer 105, and field oxide region 108 are each divided into two sections. In the notch topology shown in FIG. 1D, the antifuse is positioned on a contact formed by conductive layer 106 and polysilicon layer 105 being in physical contact. Referring to FIG. 1E which illustrates a high topology, the antifuse is positioned on top of conductive layer 106 (with an intermediate dielectric layer 107) which in turn is positioned on top of polysilicon layer 105 (with another intermediate dielectric layer 107) as well as field oxide region 108. In a low topology shown in Figure IF, the antifuse is positioned dielectric layer 107, wherein field oxide region is divided into two sections. Note that all topologies are formed on a substrate 109.

Figure 5A:
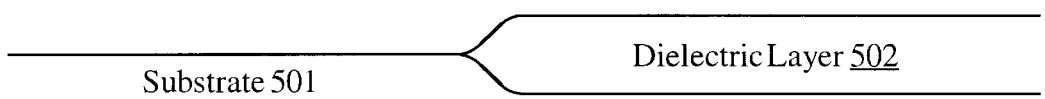
FIGS. 5A–5J illustrate the fabrication of antifuses in accordance with the present invention and having the topologies illustrated in FIGS. 1A, 1B, and 1D.
Figure 5B:
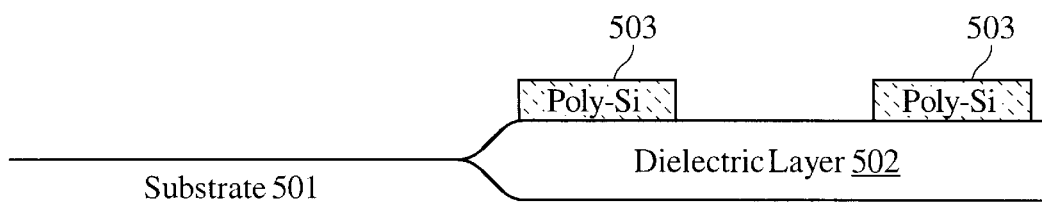
Figure 5C:
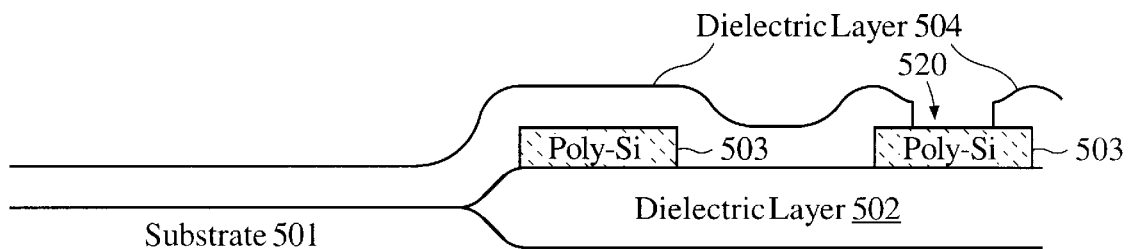

FIGS. 5A to 5J illustrate the basic steps of fabricating a plurality of over-etch (OE) antifuses in accordance with the present invention on three example topologies (i.e., flat, tilt, and notch topologies). Conventional processing steps to create the three topologies are used in FIGS. 5A to 5I, and thus are not explained in detail. In FIG. 5A, a first dielectric layer (also known by those skilled in the art as a field oxide layer) 502 is grown on a silicon substrate 501 to isolate unrelated devices. A layer of polysilicon is then deposited on the substrate and patterned to form transistor gates 503 as shown in FIG. 5B. A second dielectric layer 504 is subsequently deposited to isolate substrate 501 and transistor gates 503 from the to-be-formed upper conductive layer. In FIG. 5C, an opening 520 is formed in second dielectric layer 504 to expose one transistor gate 503.

Figure 5D:
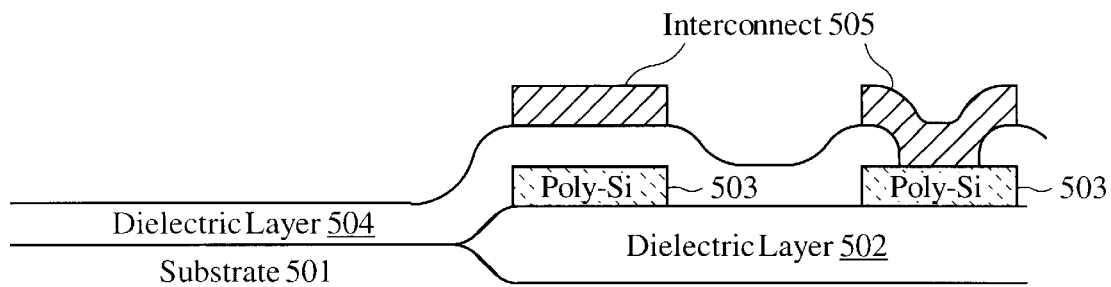
Figure 5E:
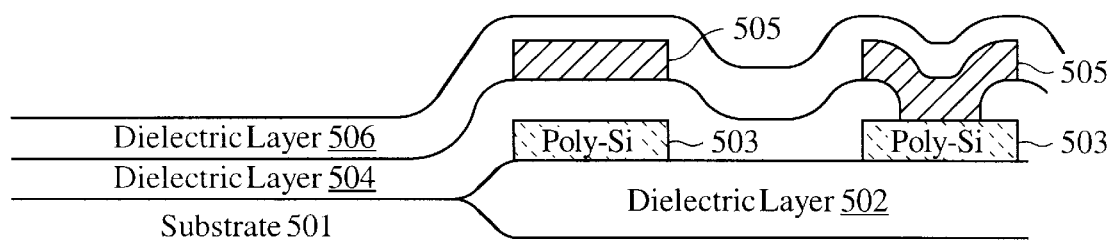
Figure 5F:
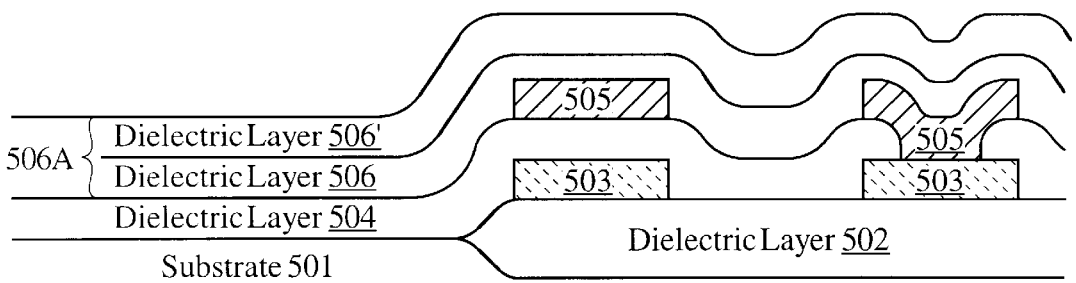

A first conductive layer is deposited and patterned to form interconnects 505 as shown in FIG. 5D. Following patterning of the conductive layer, a third dielectric layer 506 is deposited on top of second dielectric layer 504 and interconnects 505. As shown in FIG. 5E, third dielectric layer 506 conform to the existing contour, thereby creating different step heights.

To smooth the step height, a conventional planarization procedure is employed. Planarization is typically accomplished using a resist etch back in which a coating of photoresist is applied over dielectric layer 506. Due to its viscous nature, photoresist at the highest point of the underlying structure (the highest step height) will be thinner than photoresist at the lowest point of the underlying structure (the lowest step height). A non-selective plasma etch is then employed to etch the photoresist and dielectric layer 506. Specifically, during planarization, material of dielectric layer 506 at the highest point of the underlying structure is exposed first and etched while the photoresist at the lowest point of the underlying structure is still being etched. Planarization continues until all photoresist is removed. After completion of the resist etch back, the difference in step heights of dielectric layer 506 is significantly reduced. A fourth dielectric layer 506' is then deposited on dielectric layer 506. Note that dielectric layers 506 and 506' are hereinafter referenced as dielectric layer 506A.

Figure 5G:
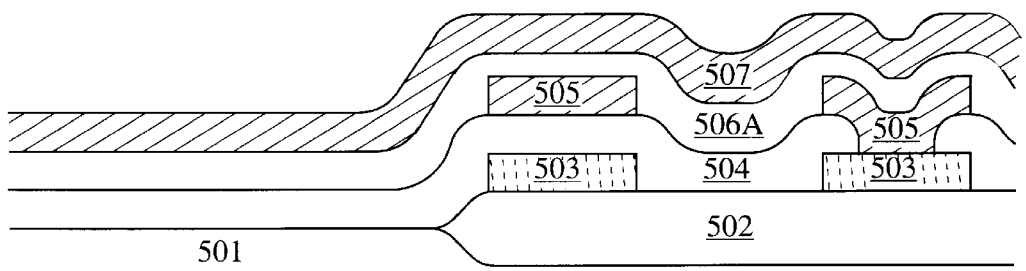
Figure 5H:
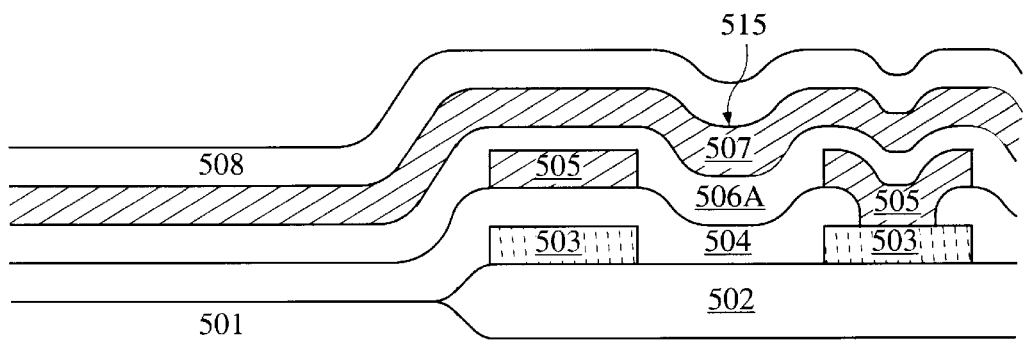

In FIG. 5G, a lower electrode of the OE antifuse of the present invention is formed by depositing a second conductive layer 507. Next, a fifth dielectric layer 508 is deposited as shown in FIG. 5H. The planarization process described above is repeated to smooth the topologies for the deposition of the third conductive layer described in reference to FIG. 5J. The above-described planarization of dielectric layer 508, although providing somewhat smoother topologies, cannot fully correct for the unequal thicknesses of dielectric layer 508 at the different topologies. For example, as shown in FIG. 5H, the dielectric thickness at the high point can be as low as 50% of the thickness of the dielectric at the low point.

Therefore, in accordance with the present invention, a controlled etch time is applied. Specifically, a predetermined thickness of dielectric layer 508 is removed by a conventional isotropic wet etch, thereby forming the upper, concave portions 509B of vias 509. An anisotropic dry etch is then used on dielectric layer 508 to form the lower portions 509A of vias 509 and expose portions of second conductive layer 507. Dry etching refers to techniques that use gases as the primary etch medium, i.e. no wet chemicals or rinsing steps are involved. Illustrative dry etching systems include; planar plasma etching, ion beam etching, and reactive ion etching. The etch time for the OE antifuses of the present invention is calculated based on the selection of the dry etchant, the composition of dielectric layer 508, the etching system used, the greatest dielectric thickness remaining at the low point, plus the amount (thickness) of desired over-etch (described in detail below).

Because different topologies require different depths of vias to fully expose the lower electrode, i.e. second conductive layer 507, a high selectivity etch is preferably used. The "selectivity" of the etch refers to the speed at which a particular etchant etches through two layers, in this case dielectric layer 508 and second conductive layer 507. In other words, the higher the selectivity, the greater the difference between the etch rate through dielectric layer 508 (i.e., a fast etch rate) and the etch rate through second conductive layer 507 (i.e., a slow etch rate). A high selectivity etch significantly minimizes the probability that, irrespective of the topology, the lower electrode is etched through during the via etching process. In accordance with the present invention, the selectivity rate typically ranges between 10:1 and 20:1.

Figure 5I:
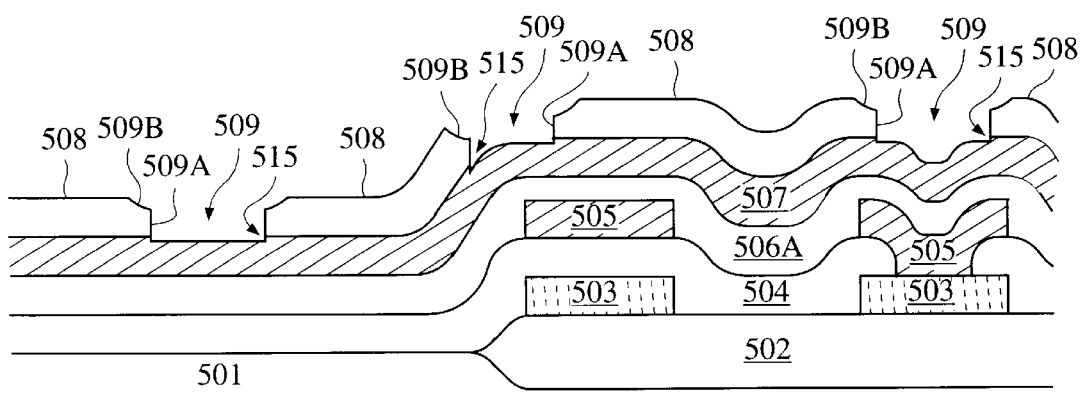
Figure 5J:
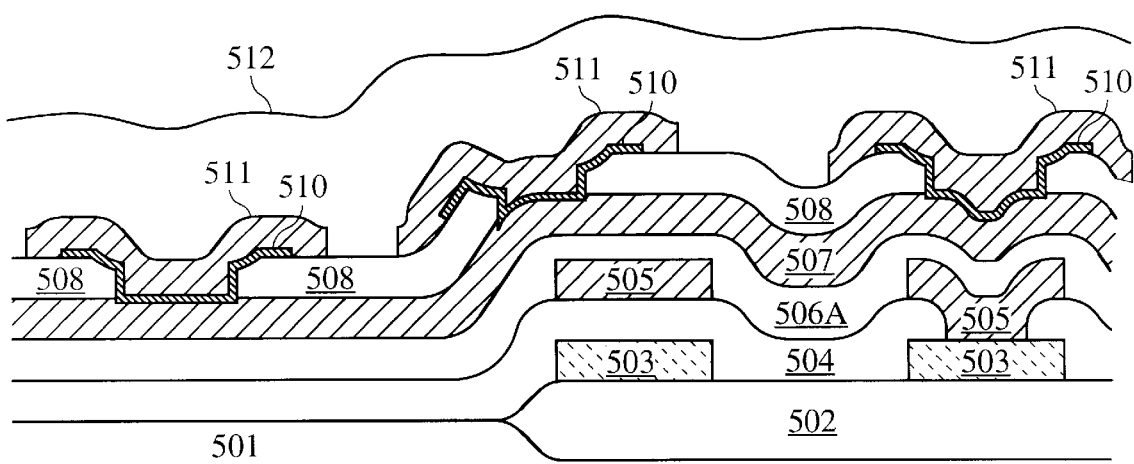

Referring to FIG. 5I, trenches 515 are formed in second conductive layer 507 by an over-etch of vias 509. In one embodiment, the depth of trenches 515 is approximately the thickness of the to-be-deposited antifuse layer. For example, in some embodiments, the depth of trenches 515 is between 80% and 120% the thickness of the antifuse layer. In preferred embodiments, the depth of trenches 515 is equal to or greater than the thickness of the antifuse layer. Subsequently, an amorphous silicon layer (the antifuse layer) 510 is deposited into vias 509. Finally, antifuse layer 510 is patterned, and a third conductive layer 511 and a protective dielectric layer 512 are deposited as shown in FIG. 5J.

Illustrative materials used in the various layers of the OE antifuses and their fabrication are provided, for example, in U.S. Pat. No. 5,475,253, issued Dec. 12, 1995 to Look et al., which is incorporated herein by reference. For example, in one embodiment, lower electrode 507 is approximately 4500 Å to 7000 Å thick and includes two layers: a bottom layer of aluminum (Al) having a thickness of approximately 3500 Å to 6500 Å and a top layer of titanium-tungsten (TiW) having a thickness of approximately 1000 Å to 3000 Å. In other embodiments, the bottom layer is aluminum-silicon (AlSi) or aluminum-silicon-copper (AlSiCu, and the top layer is titanium-nitride (TiN). In yet other embodiments of the present invention, lower electrode 507 is formed solely from titanium-tungsten (TiW).

Dielectric layer 508, for example silicon dioxide, is deposited to a thickness of approximately 15,000 Å, The planarization etch removes approximately 9,000 Å to 11,000 Å of dielectric layer 508. After this etch, another oxide layer is deposited to a thickness between 9,000 Å and 10,000 Å on the first oxide layer.

As previously described, an isotropic etch forms vias 509 (FIG. 5I). Typically, this isotropic etch uses a conventional, diluted HF solution which etches down approximately 5500 Å to 7500 Å. In one embodiment of the present invention, the HF solution etches down 6500 Å. In other embodiments, other etching processes, such as a plasma etch, are used to provide the appropriate angle. This angle ensures good step coverage of the to-be-formed antifuse layer and the upper conductive layer in vias 509. In one embodiment, the anisotropic etch is a plasma etch including a mixture of Freon-23 ($CHF_3$) and oxygen ($O_2$) at approximately 25° C. This anisotropic etch provides the portions 509A.

Subsequent to via definition, an oxygen plasma treatment is performed, thereby producing an oxide of the material of lower electrode 507. Thus, this thin oxide layer, typically between 35 Å and 70 Å thick, is either titanium oxide, tungsten oxide, or a mixture of titanium oxide and tungsten oxide.

Antifuse layer 510 is typically deposited to a thickness of between 350 Å and 550 Å and is formed by using pure silane gas ($SiH_4$). In another embodiment, a mixture of silane gas and nitrogen ($N_2$) is used. To improve the amorphous nature of antifuse layer 510, i.e. break up any small crystals and reduce leakage, an argon implant, not shown, is performed at a dosage of $1 \times 10^{16}$ atoms/cc and an energy of 30 keV. Other implant dopants such as silicon, oxygen, or arsenic are alternatively used in other embodiments. In other embodiments, another oxygen plasma treatment is performed, thereby forming a silicon dioxide layer approximately 10–30 Å thick which covers antifuse layer 510. In one embodiment, upper electrode 511 includes a titanium layer, a titanium-tungsten layer, and an aluminum-silicon-copper alloy layer. In other embodiments, upper electrode 511 is formed from consecutive layers of titanium, titanium-nitride, titanium-tungsten, or consecutive layers of aluminum, aluminum-silicon, and aluminum-silicon-copper.

However, the present invention is not limited to the embodiments above-described. Specifically, regardless of antifuse composition and fabrication, the present invention significantly reduces the programming voltage distribution in comparison to conventional antifuses.

It is believed that trenches 515 increase the probability that antifuse layer 510 forms substantially orthogonal angles with conductive layer 507 (the lower electrode) arid conductive layer 510 (the upper electrode) in at least one location on the perimeter of via 509 irrespective of topology. This geometry enhances the electric field at this location during programming, thereby increasing the probability that the OE antifuse will program at that location.

In conventional antifuses, the etching through the dielectric layer to the lower electrode is typically accomplished with a slight over-etch to ensure the lower electrode is exposed. However, as the topology varies, the depth of the trench resulting from the over-etch may also vary. Different trench depths result in different angles formed at the perimeters of the via, and thus, it is believed, different programming voltages. Thus, conventional antifuses formed on various topologies have a broad programming voltage distribution.

Figure 2A:
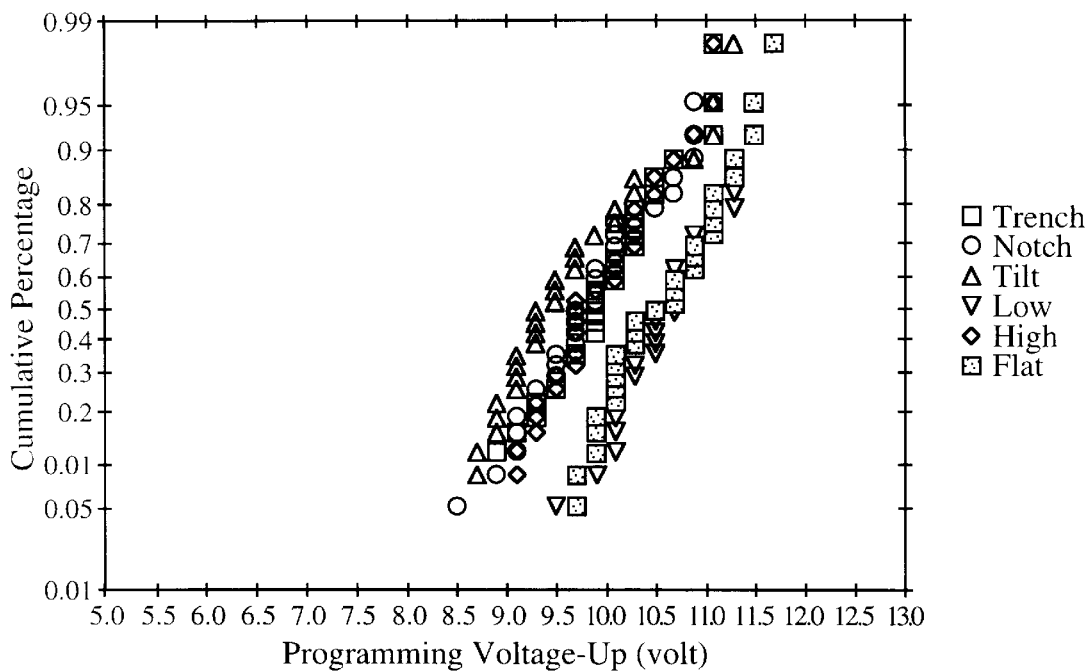
FIG. 2A is a graph showing the distribution of actual programming voltages for a population of conventional antifuses placed on different underlying topologies.
Figure 2B:
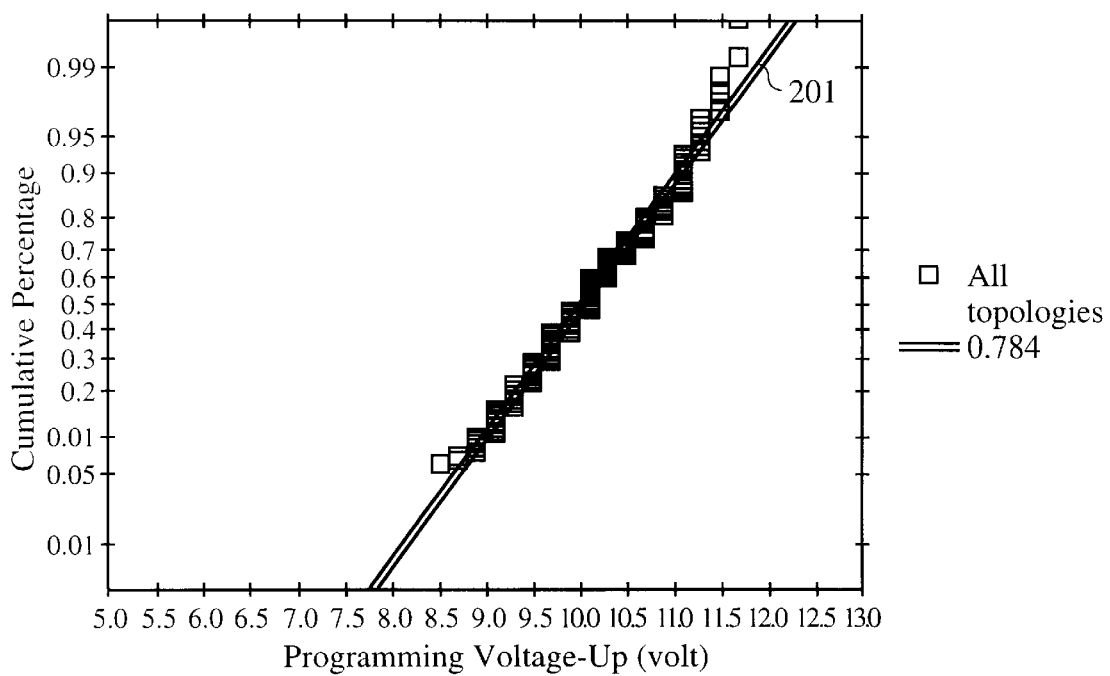
FIG. 2B is a graph showing the distribution of actual programming voltages for a population of antifuses placed on various underlying topologies.

FIG. 2A is a graph showing the distribution of actual programming voltages for a population of conventional antifuses formed on various topologies, wherein the x axis represents the voltage needed to program the antifuses and the y axis represents the cumulative probability of antifuses tested which are programmed at a voltage at or below a particular programming voltage. As noted in FIG. 2A, antifuses on tilt, high, notch and trench topologies program at a lower voltage than antifuses on the low and flat topologies. FIG. 2B condenses the data contained in FIG. 2A, wherein the slope of line 201 corresponds to the standard deviation of the distribution of the voltages required to program the antifuses formed on any of the above-described topologies. In this population, the difference between high and low programming voltages (the "range") for the antifuses on the six topologies is approximately 3.5 volts.

Figure 3A:
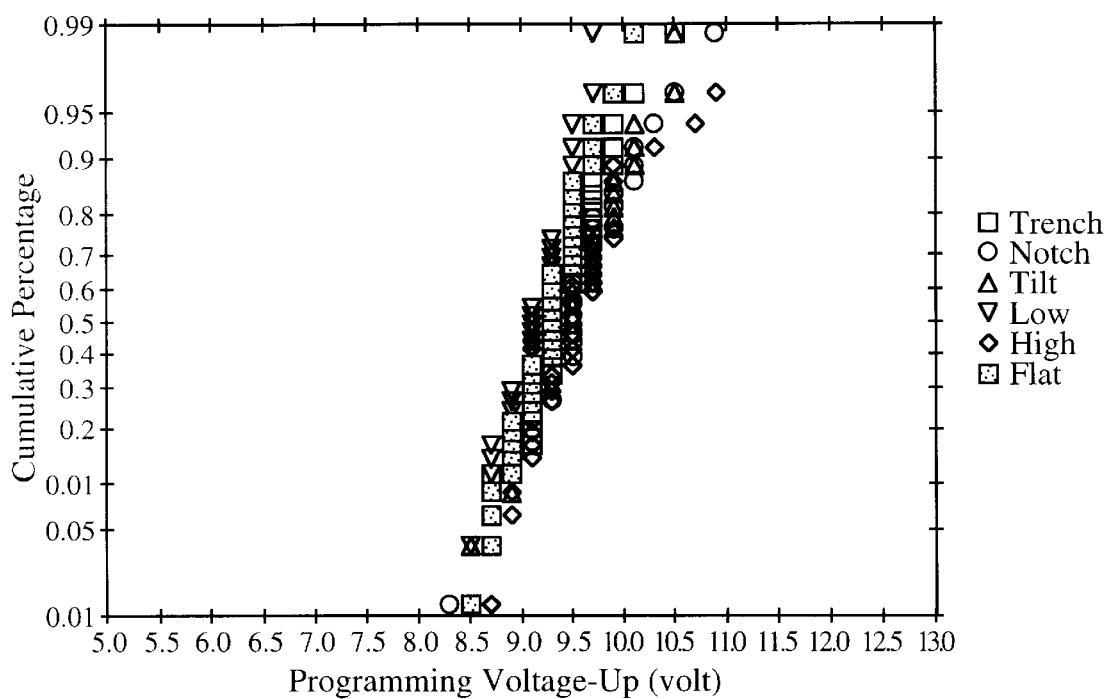
FIG. 3A is a graph showing the distribution of actual programming voltages for a population of over-etched antifuses formed on different underlying topologies.
Figure 3B:
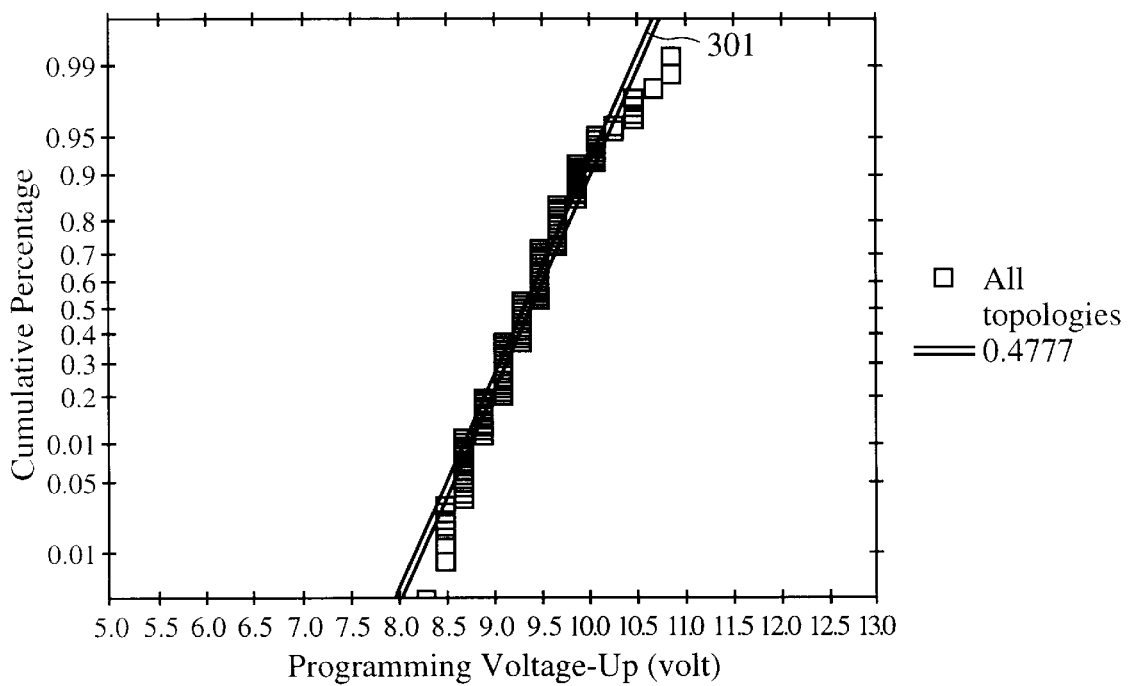
FIG. 3B is a graph showing the distribution of actual programming voltages for a population of over-etched antifuses formed on various underlying topologies.

In contrast, FIG. 3A is a graph showing the distribution of actual programming voltages for a population of the over-etched (OE) antifuses of the present invention. Comparing FIGS. 3A and 2A, the present invention significantly decreases the difference between the programming voltages of antifuses on the low/flat topologies and the programming voltages of antifuses on the trench/notch/tilt/high topologies. FIG. 3B condenses the data contained in FIG. 3A, wherein the slope of line 301 corresponds to the standard deviation of the distribution of the voltages required to program the OE antifuses formed on any of the above-described topologies. Comparing FIGS. 2B and 3B, if both OE antifuses and conventional antifuses are formed on the above-described topologies, the range of the voltages required to program the OE antifuses is significantly smaller than the range of the voltages required to program conventional antifuses randomly placed on any topology. In one embodiment of the present invention, the OE antifuses improve, i.e. decrease, the range by over 1.0 volt compared to conventional antifuses.

Figure 4:
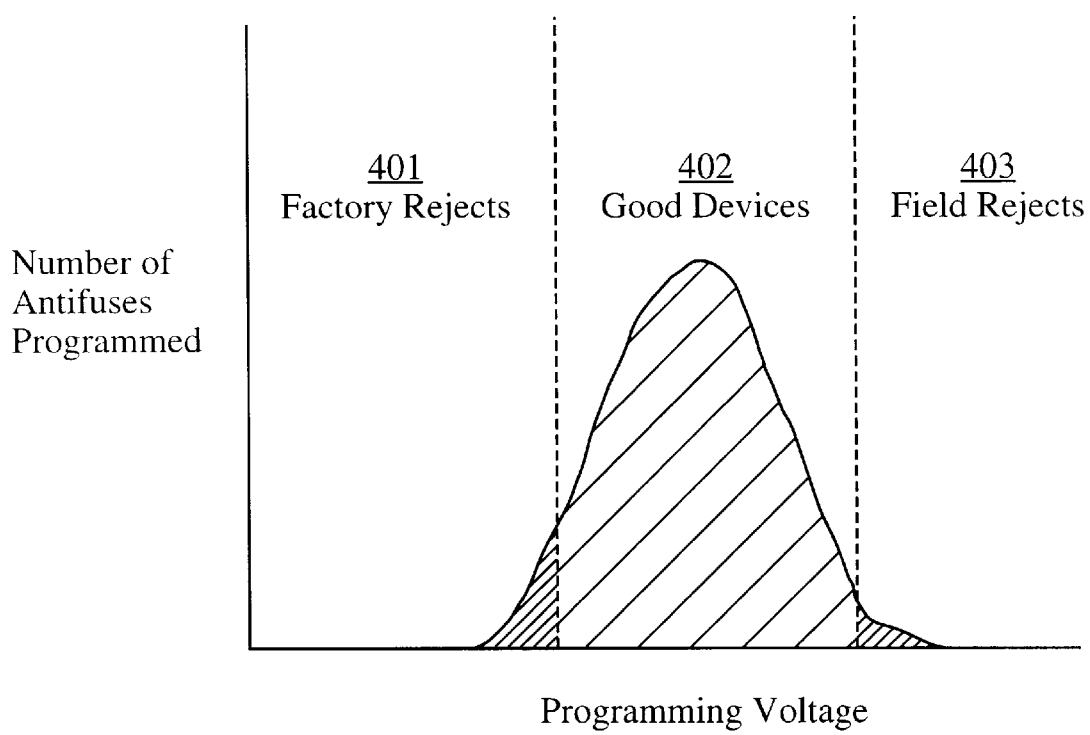
FIG. 4 illustrates a distribution of devices containing antifuses by programming voltage.

The resulting tighter distribution of the programming voltage provided by the present invention is important to the commercial production of devices containing antifuses as shown in reference to FIG. 4. FIG. 4 illustrates a hypothetical distribution of voltages at which antifuses in a set of devices are programmed. The voltage distribution is divided into three voltage regions: 401, 402, and 403.

Devices containing antifuses that are programmed in voltage region 401 represent factory rejects, i.e., devices identified by the factory as containing antifuses that are programmed at voltages below the maximum operating voltage for which the device is rated. If any antifuses are programmed in region 401, the device is discarded by the factory. Because these devices will not be sold to an end user, these devices represent lost profits to the manufacturer. Devices that only contain antifuses that are programmed within voltage region 402 correspond to functioning ("good") devices. Devices containing antifuses that are programmed in voltage region 403 represent field rejects, i.e., devices identified by the end user as containing antifuses that do not program at the programming voltage used by the device.

The tighter distribution of the programming voltages provided by the present invention signifies a reduction in the number of devices produced which fall into the factory reject category. Thus, the devices containing the OE antifuses of the present invention enhance production yield. Additionally, because active circuits can be placed underneath the OE antifuses, the present invention dramatically reduces chip size in comparison to conventional devices.

The above description is illustrative only and not limiting. These and other embodiments of trench depths, antifuse structures, selectivity rates, and topologies may fall within the scope of the invention, as defined by the following claims.

What is claimed is:

1. An antifuse including:
   a first conductive layer formed on a surface;
   a dielectric layer formed on said first conductive layer;
   an over-etched via formed in said dielectric layer and said first conductive layer;
   an antifuse layer formed in said via; and
   a second conductive layer formed on said antifuse layer and said dielectric layer.

2. The antifuse of claim 1 wherein said first conductive layer is a lower electrode.

3. The antifuse of claim 1 wherein said antifuse layer includes amorphous silicon.

4. The antifuse of claim 1 wherein said second conductive layer is an upper electrode.

5. An antifuse comprising:

a first conductive layer formed on a surface;

a dielectric layer formed on said first conductive layer;

an over-etched via formed in said dielectric layer and said first conductive layer, wherein said over-etched via forms a trench in said first conductive layer;

an antifuse layer formed in said via; and a second conductive layer formed on said antifuse layer and said dielectric layer.

6. The antifuse of claim 5 wherein said first conductive layer is a lower electrode.

7. The antifuse of claim 5 wherein said antifuse layer includes amorphous silicon.

8. The antifuse of claim 5 wherein said second conductive layer is an upper electrode.

* * * * *